United States Patent
Ayama

(10) Patent No.: US 8,383,209 B2
(45) Date of Patent: Feb. 26, 2013

(54) MAGNETIC RECORDING MEDIUM MANUFACTURING METHOD AND LAMINATE MANUFACTURING METHOD

(75) Inventor: Kenji Ayama, Singapore (SG)

(73) Assignee: WD Media (Singapore) Pte. Ltd., Singapore (SG)

( * ) Notice: Subject to any disclaimer, the term of this patent is extended or adjusted under 35 U.S.C. 154(b) by 380 days.

(21) Appl. No.: 12/443,142

(22) PCT Filed: Sep. 26, 2007

(86) PCT No.: PCT/JP2007/068656
§ 371 (c)(1),
(2), (4) Date: Mar. 26, 2009

(87) PCT Pub. No.: WO2008/041578
PCT Pub. Date: Apr. 10, 2008

(65) Prior Publication Data
US 2010/0028560 A1 Feb. 4, 2010

(30) Foreign Application Priority Data
Sep. 27, 2006 (JP) .................. 2006-262424

(51) Int. Cl.
*H01F 1/00* (2006.01)
*H05H 1/00* (2006.01)
*G11B 5/00* (2006.01)

(52) U.S. Cl. ........ 427/571; 427/127; 427/128; 427/130; 427/131; 427/535; 427/599; 427/598

(58) Field of Classification Search .................. 427/569, 427/127, 130, 598–599, 571, 535
See application file for complete search history.

(56) References Cited

U.S. PATENT DOCUMENTS

| | | | | |
|---|---|---|---|---|
| 4,430,361 | A | * | 2/1984 | Robinson et al. ............. 427/571 |
| 5,099,790 | A | * | 3/1992 | Kawakami ............ 118/723 MR |
| 6,171,659 | B1 | * | 1/2001 | Vanden Brande et al. .... 427/523 |
| 6,316,062 | B1 | * | 11/2001 | Sakaguchi et al. ............ 427/570 |
| 2001/0031382 | A1 | * | 10/2001 | Kusakawa et al. ...... 428/694 TC |
| 2003/0219989 | A1 | * | 11/2003 | Terasaki et al. ............... 438/725 |

FOREIGN PATENT DOCUMENTS

| | | |
|---|---|---|
| JP | 2004-362746 A | 12/2004 |
| JP | 2005-209326 A | 8/2005 |
| WO | 99/14746 A1 | 3/1999 |

OTHER PUBLICATIONS

English machine translation of JP2005-209326. Accessed by examiner on Oct. 21, 2012.*
Written Opinion dated May 14, 2010 from Singapore Patent Application No. 200901980-3, 10 pages.

* cited by examiner

*Primary Examiner* — Timothy Meeks
*Assistant Examiner* — Mandy Louie

(57) ABSTRACT

[Problems] To have a thin film suitably function even when the thickness of the thin film is reduced.
[Means for Solving Problems] Provided is a method for manufacturing a magnetic recording medium by forming a thin film on a substrate (12). The method is provided with a thin film forming step of forming the thin film by using a substance brought into the plasma state as a material. In the thin film forming step, the thin film is formed by using a material substance gathering means (30) for gathering the substance brought into the plasma state to the periphery of the substrate. The material substance gathering means (30) gathers the substance brought into the plasma state, to the periphery of the substrate (12) by generating a magnetic field at the periphery of the substrate (12).

5 Claims, 4 Drawing Sheets

MAGNETIC RECORDING MEDIUM MANUFACTURING METHOD AND LAMINATE MANUFACTURING METHOD

TECHNICAL FIELD

This invention relates to a method of manufacturing a magnetic recording medium and a method of manufacturing a laminate.

BACKGROUND ART

Nowadays, the information recording technique, particularly the magnetic recording technique, requires a radical technological innovation following the development of the IT industry. For magnetic disks adapted to be mounted in magnetic disk apparatuses such as HDDs (hard disk drives), there is required a technique capable of achieving an information recording density of 60 Gbit/inch$^2$ to 100 Gbit/inch$^2$ or more. Hitherto, in a magnetic disk, a magnetic layer adapted to record information is provided on a nonmagnetic substrate and, on the magnetic layer, there are provided a protective layer for protecting the magnetic layer and a lubricating layer for reducing interference from a flying magnetic head. Further, there has heretofore been proposed a method of forming a protective layer by a plasma CVD method for ensuring the wear resistance and sliding properties of a magnetic disk (see, e.g. Patent Document 1).

Patent Document 1: International Publication No. 99/014746 Pamphlet

DISCLOSURE OF THE INVENTION

Problem to be Solved by the Invention

For magnetic disks, a demand for an increase in recording density has been becoming stronger year by year. In the demand for the increase in recording density in recent years, various approaches have been made. As one of them, it is required to reduce the distance (magnetic spacing) between the center, in a thickness direction, of a magnetic layer of a magnetic disk and a recording/reproducing element of a magnetic head for improving the S/N ratio of a recording signal by improving the spacing loss. For example, in order to achieve an information recording density of 60 Gbit/inch$^2$ or more, it is required to reduce the magnetic spacing to 20 nm or less.

Herein, taking into account the distance from the surface of the magnetic disk to the center in the thickness direction of the magnetic layer, the flying height of the magnetic head is currently set to 10 nm or less and thus a further reduction thereof is difficult. Further, when the flying height of the magnetic head is set to 10 nm or less, there is a possibility of occurrence of a problem that intermittent contact between the magnetic head and the magnetic disk occurs to make the flight unstable or even a serious problem that contamination occurs on a recording/reproducing element portion of the magnetic head to disable recording/reproduction. Therefore, studies have been performed to reduce the thicknesses of a protective layer and so on provided between the magnetic layer and the disk surface.

However, if, for example, the thickness of the protective layer is simply reduced, the properties necessary for the protective layer cannot be ensured. For example, in the case where use is made, as the protective layer, of a structure in which a layer containing carbon and nitrogen for improving adhesion to a lubricating layer is formed at the outermost surface of a hydrocarbon protective film, if the thickness of the hydrocarbon protective film is simply reduced, sufficient wear resistance and sliding properties cannot be ensured. On the other hand, if the thickness of the layer containing carbon and nitrogen at the outermost surface is simply reduced, the adhesion to the lubricating layer decreases. In this case, there arises a pick-up problem that the magnetic head picks up a lubricant not adhering to the protective layer as the lubricating layer, or the like.

As described above, if the thickness of the protective layer is simply reduced, there arise various problems. Then, in such a case, there arises a problem such that fine scratches or the like occur on the magnetic disk to degrade a recording/reproducing signal.

Further, in recent years, as a HDD start/stop mechanism, it has been required to employ, instead of the conventional CSS system, the LUL system (ramp load system) capable of increasing the capacity. In an LUL-system magnetic disk apparatus, if the thickness of a protective layer is simply reduced as described above, the possibility is considered to be higher that there arises a problem that fine scratches or the like occur on a magnetic disk due to impact upon loading of a magnetic head on the magnetic disk, thereby degrading a reproducing signal.

This invention has been made in view of the problems described above and has an object to provide a magnetic recording medium manufacturing method and so on that can ensure the wear resistance and sliding properties and, further, improve the adhesion between a protective layer and a lubricating layer, for example, even when the thickness of the protective layer is 5 nm or less.

Means for Solving the Problem

In order to solve the above problems, this invention has the following structures.

(Structure 1) A magnetic recording medium manufacturing method of forming a thin film over a substrate, said magnetic recording medium manufacturing method characterized by comprising a thin film forming step of forming said thin film using a plasma-converted substance as a material, wherein said thin film forming step forms said thin film using material substance concentration means for gathering said plasma-converted substance around said substrate.

With this structure, the formation of the thin film can be efficiently carried out. Further, for example, by concentrating the material substance, the density of the substance necessary for exhibiting the function of the thin film can be increased in the thin film to be formed. Therefore, even if the thickness of the thin film is reduced, the function of the thin film can be properly exhibited. This makes it possible to reduce the thickness of the thin film.

The thin film forming step may be a step of forming the thin film while applying a bias voltage to the substrate. With this structure, the plasma-converted substance being a material of the thin film can be attracted around the substrate. In this case, the material substance concentration means gathers the plasma-converted substance around the substrate by a method different from the bias voltage. For example, the material substance concentration means gathers the plasma-converted substance around the substrate by a method other than an electric force. The electric force is, for example, an electric attractive or repulsive force directed in the tangential direction of the electric line of force.

The material substance concentration means gathers the plasma-converted substance around the substrate by, for example, an electromagnetic force. In this case, for example, by applying a bias voltage to the substrate to move the plasma-converted substance in a fixed direction, it is possible to control the direction of the electromagnetic force applied to the plasma-converted substance.

Further, for example, when forming the thin film by a chemical reaction of the plasma-converted substance over the substrate, the material substance concentration means may use, as a pressurizing gas, a gas with a property that does not participate in the chemical reaction over the substrate, thereby gathering the plasma-converted substance around the substrate. In this case, for example, the material substance concentration means supplies the pressurizing gas, while controlling its blowing direction, to push the plasma-converted substance toward the substrate, thereby gathering the plasma-converted substance around the substrate.

(Structure 2) Said material substance concentration means gathers said plasma-converted substance around said substrate by generating a magnetic field around said substrate.

With this structure, the plasma-converted substance can be properly gathered. The material substance concentration means generates the magnetic field using, for example, a permanent magnet or an electromagnet. In the case of using the permanent magnet, for example, since it is not necessary to supply the power to the magnet, the structure of an apparatus can be simplified. On the other hand, in the case of using the electromagnet, for example, since the degree of freedom of adjustment of the strength of the magnetic field increases, the plasma-converted substance can be gathered more properly. It is preferable that the arrangement of the permanent magnet or the electromagnet be, for example, properly optimized according to the structure of a film forming apparatus, or the like.

In the case where the electromagnet is used, it is considered that the power consumption during the film formation may increase. However, for example, when the film formation is carried out while applying the bias voltage to the substrate, it becomes possible to reduce the bias voltage by the use of the material substance concentration means. Therefore, even in the case where the electromagnet is used, it is possible to reduce the total power consumption.

(Structure 3) Said material substance concentration means generates the magnetic field around said substrate using a magnet having a maximum energy product of 1.0 to 50 MGOe.

With this structure, it is possible to generate the magnetic field with the strength suitable for gathering the plasma-converted substance around the substrate. If the maximum energy product is less than 1.0 MGOe, there is a possibility that the effect of gathering the plasma-converted substance around the substrate cannot be sufficiently expected. On the other hand, a magnet with a maximum energy product exceeding 50 MGOe is difficult to procure and thus causes an increase in cost.

(Structure 4) The magnetic recording medium manufacturing method further comprises a magnetic layer forming step of forming a magnetic layer over said substrate, and a protective film forming step of forming a hydrocarbon protective film over said magnetic layer, wherein said thin film forming step is a step of introducing nitrogen into a surface of said hydrocarbon protective film by a plasma CVD method using a nitrogen gas, thereby forming a film containing the nitrogen at an outermost surface of said hydrocarbon protective film.

The hydrocarbon protective film other than the outermost surface introduced with the nitrogen and the film containing the nitrogen and formed at the outermost surface form a protective layer of a magnetic recording medium. The hydrocarbon protective film is a high-density, high-hardness film and, by forming the hydrocarbon protective film, it is possible to ensure the wear resistance and sliding properties of the magnetic recording medium. Further, by forming the film containing the nitrogen at the outermost surface of the hydrocarbon protective film, it is possible to enhance adhesion to a lubricating layer formed on this film.

In terms of improving the spacing loss, the protective layer is highly required to be reduced in thickness. Therefore, in the protective layer, it is important to have the hydrocarbon protective film and the film containing the nitrogen at the outermost surface exhibit their functions with thicknesses as small as possible, respectively.

In this regard, with Structure 4, it is possible to efficiently introduce nitrogen into the outermost surface of the hydrocarbon protective film. Therefore, for example, even if the thickness of the film containing the nitrogen is reduced, it is possible to sufficiently enhance adhesion to the lubricating layer. By this, even if the thickness of the hydrocarbon protective film to be formed in the protective film forming step is reduced, it is possible to ensure the required wear resistance and sliding properties.

Therefore, with this structure, the thickness of the protective layer can be properly reduced. This makes it possible to reduce the magnetic spacing and thus to improve the S/N ratio of a recording signal. Further, by improving the S/N ratio, the recording density can be improved.

The hydrocarbon protective film formed in the protective film forming step may be a film containing carbon as a main component, wherein the content of hydrogen is low as compared with that of carbon. The hydrocarbon protective film preferably contains diamond-like carbon as the main-component carbon.

The protective film forming step forms the hydrocarbon protective film by, for example, a sputtering method or a plasma CVD method. In the case of using the sputtering method, high-speed film formation is enabled. On the other hand, in the case of using the plasma CVD method, it is possible to form the hydrocarbon protective film having high density and high hardness. In the case of using the plasma CVD method, the protective film forming step preferably forms the hydrocarbon protective film having a thickness of 5 nm or less.

(Structure 5) Said thin film forming step forms the film containing the nitrogen at the outermost surface of said hydrocarbon protective film by applying a bias voltage to said substrate.

With this structure, the plasma-converted nitrogen can be attracted to the substrate by an electric field generated by this bias voltage. Further, for example, when the material substance concentration means is means for generating a magnetic field, by moving the plasma-converted nitrogen in a fixed direction by a force due to the bias voltage, it is possible to determine the moving direction of the plasma-converted nitrogen being the charge subjected to an electromagnetic force. In this case, since it becomes possible to properly control the direction of the electromagnetic force applied to the plasma-converted nitrogen, the plasma-converted nitrogen can be more properly gathered around the substrate. This makes it possible to more properly form the film containing the nitrogen at the outermost surface of the hydrocarbon protective film.

(Structure 6) Said thin film forming step applies an RF bias with a power of 400 W or less to said substrate. If the RF bias exceeding 400 W is applied, there is a possibility of occurrence of damage or the like to the substrate. On the other hand, with this structure, it is possible to properly apply the bias voltage to the substrate.

Further, using the RF bias, it is possible to generate a plasma by the use of the bias voltage applied to the substrate. Therefore, with this structure, for example, as compared with the case where the application of a bias voltage to the substrate and the supply of a high-frequency voltage for generating a plasma are separately carried out, the structure of the film forming apparatus can be simplified.

(Structure 7). Said protective film forming step forms said hydrocarbon protective film having a thickness of 5 nm or less, and said thin film forming step forms the film containing the nitrogen wherein an atomic ratio (N/C) of nitrogen to carbon at the outermost surface is 0.05 to 0.15.

With this structure, the thickness of the film containing the nitrogen and formed at the outermost surface of the hydrocarbon protective film can be reduced while sufficiently maintaining the adhesion to the lubricating layer. This makes it possible to properly reduce the thickness of the entire protective layer. The atomic ratio (N/C) of nitrogen to carbon at the outermost surface of the hydrocarbon protective film is more preferably set to 0.05 to 0.10. With this structure, the thickness of the portion where nitrogen is introduced can be further reduced while introducing a sufficient amount of nitrogen.

(Structure 8) The magnetic recording medium manufacturing method further comprises a magnetic layer forming step of forming a magnetic layer over said substrate, wherein said thin film forming step is a step of forming a hydrocarbon protective film over said magnetic layer by a plasma CVD method using a hydrocarbon gas.

With this structure, for example, plasma-converted carbon being a material of the hydrocarbon protective film can be concentrated around the substrate. Therefore, it is possible to form the hydrocarbon protective film with higher density and higher hardness. By this, for example, even if the thickness of the hydrocarbon protective film is reduced, it is possible to ensure the wear resistance and sliding properties of the magnetic recording medium. Therefore, this makes it possible to properly reduce the thickness of the entire protective layer including the hydrocarbon protective film.

(Structure 9) A laminate manufacturing method of forming a thin film over a substrate, said laminate manufacturing method characterized by comprising a thin film forming step of forming said thin film using a plasma-converted substance as a material, wherein said thin film forming step forms said thin film using material substance concentration means for gathering said plasma-converted substance around said substrate. With this structure, it is possible to obtain the same effect as that of Structure 1.

EFFECT OF THE INVENTION

According to this invention, for example, it is possible to have a thin film suitably function even when the thickness of the thin film is reduced.

BEST MODE FOR CARRYING OUT THE INVENTION

Hereinbelow, embodiments according to this invention will be described with reference to the drawings. FIG. 1 shows one example of the structure of a magnetic recording medium 10 manufactured by a magnetic recording medium manufacturing method according to one embodiment of this invention. The magnetic recording medium 10 is a magnetic disk for an LUL system (ramp load system) HDD. The information recording density of the magnetic recording medium 10 is, for example, 60 Gbit/inch$^2$ or more (e.g. 60 to 100 Gbit/inch$^2$).

In this example, the magnetic recording medium 10 comprises a substrate 12, an underlayer 14, a magnetic layer 16, a protective layer 18, and a lubricating layer 20. The substrate 12 is a substrate on which the respective layers of the magnetic recording medium 10 are laminated. The substrate 12 is preferably a glass substrate such as, for example, an aluminosilicate amorphous glass substrate. The underlayer 14 is a layer for controlling the crystal structure of the magnetic layer 16. The magnetic layer 16 is a magnetic recording layer adapted to record information. The substrate 12, the underlayer 14, and the magnetic layer 16 may have, for example, the same or similar structures as those of a known substrate, underlayer, and magnetic recording layer.

The protective layer 18 is a layer mainly containing carbon and serves to protect the magnetic layer 16 from impact due to contact with a magnetic head, and so on. In this example, the protective layer 18 comprises a hydrocarbon protective film 22 and a nitrogen-containing film 24. The hydrocarbon protective film 22 is a high-density, high-hardness film mainly containing diamond-like carbon. By forming the hydrocarbon protective film 22, it is possible to ensure the wear resistance and sliding properties of the magnetic recording medium 10.

The nitrogen-containing film 24 is a film formed by introducing nitrogen into the outermost surface of the hydrocarbon protective film 22. The nitrogen-containing film 24 contains carbon and nitrogen in an atomic ratio (N/C) of, for example, 0.05 to 0.15 and preferably 0.05 to 0.10 and has higher adhesion to the lubricating layer 20 than the hydrocarbon protective film 22. Therefore, by forming the nitrogen-containing film 24, the adhesion between the protective layer 18 and the lubricating layer 20 can be enhanced.

The lubricating layer 20 is a layer for reducing interference from a flying magnetic head and, for example, may be the same as or similar to a known lubricating layer. The lubricating layer 20 is preferably a layer containing a perfluoropolyether compound having a hydroxyl group as a terminal group. Perfluoropolyether has a straight-chain structure and exhibits proper lubricating performance and, by having a hydroxyl group (OH) as a terminal group, it can exhibit high adhesion performance to the protective layer 18. Particularly, in the structure of this example having the nitrogen-containing film 24 at the outermost surface portion of the protective layer 18, since (N+) and (OH—) have high affinity for each other, it is possible to obtain high adhesion therebetween, which is thus preferable.

The atomic ratio (N/C) of nitrogen to carbon in the nitrogen-containing film 24 can be measured using, for example, an X-ray photoelectron spectroscopy method (hereinafter referred to as ESCA). The atomic ratio of nitrogen to carbon can be derived from the intensity of the NIs spectrum and the intensity of CIs spectrum measured by the ESCA. When N/C is less than 0.05, there is a possibility that the adhesion to the lubricating layer 20 becomes insufficient. On the other hand, when N/C exceeds 0.15, it is considered that the thickness of the nitrogen-containing film 24 is greater than necessary and thus the thickness of the hydrocarbon protective film 22 is correspondingly smaller. In this case, there is a possibility that the hardness of the protective layer 18 as a whole decreases, which is thus not preferable. Accordingly, by setting N/C to fall within the range of 0.05 to 0.15, the adhesion between the protective layer 18 and the lubricating layer 20 and the hardness can be particularly suitable. It is particularly preferable that N/C be set in the range of 0.05 to 0.10. With this configuration, the thickness of the nitrogen-containing film 24 can be further reduced while ensuring necessary adhesion.

The magnetic recording medium 10 may be a perpendicular magnetic recording medium. In this case, the magnetic recording medium 10 further comprises, for example, an adhesive layer and a soft magnetic layer between the substrate 12 and the underlayer 14. Further, in this case, the magnetic recording medium 10 preferably further comprises a coupling control layer and an exchange energy control layer (continuous film layer: continuous layer) between the magnetic layer 16 and the protective layer 18.

FIG. 2 is a flowchart showing one example of a method of manufacturing the magnetic recording medium 10 of this example. In this example, the manufacturing method first prepares the substrate 12 (preparation step S102) and then performs formation of the underlayer 14 (underlayer forming step) and formation of the magnetic layer 16 (magnetic layer forming step S106) by, for example, a known magnetron sputtering method. Subsequently, by a method which will be described in detail hereinbelow, the protective layer 18 is formed on the magnetic layer 16 (protective layer forming step S108) and, further, by, for example, a known dipping method or the like, the lubricating layer 20 is formed on the protective layer 18 (lubricating layer forming step S110).

Hereinbelow, the protective layer forming step S108 will be described in further detail. In this example, the protective layer forming step S108 comprises a hydrocarbon protective film forming step S202 and a nitrogen-containing film forming step S204.

The hydrocarbon protective film forming step S202 is a step of forming the hydrocarbon protective film 22 on the magnetic layer 16 and forms the hydrocarbon protective film 22 by, for example, a sputtering method or a plasma CVD method. The hydrocarbon protective film forming step S202 forms the hydrocarbon protective film having a thickness of, for example, 5 nm or less and preferably 3 nm or less (e.g. 1 to 3 nm). The thickness of the hydrocarbon protective film 22 is preferably 1 nm or more. If less than 1 nm, there is a case where the coverage for the magnetic layer 16 is so small as to be insufficient to prevent migration of metal ions of the magnetic layer 16. Further, there is a problem in wear resistance.

When forming the hydrocarbon protective film 22 by the plasma CVD method, it is preferable to use only a hydrocarbon gas as a reactive gas to form diamond-like carbon. In the case where another inert gas (e.g. Ar or the like) or a carrier gas such as a hydrogen gas is mixed with a hydrocarbon gas, such an impurity gas is introduced into the hydrocarbon protective film 22 to lower the film density, which is thus not preferable.

As the reactive gas, it is preferable to use a lower hydrocarbon. Especially, it is preferable to use a straight-chain lower hydrocarbon such as a straight-chain lower saturated hydrocarbon or a straight-chain lower unsaturated hydrocarbon. As the straight-chain lower saturated hydrocarbon, use can be made of methane, ethane, propane, butane, octane, or the like. As the straight-chain lower unsaturated hydrocarbon, use can be made of ethylene, propylene, butylene, acetylene, or the like. The lower hydrocarbon referred to herein represents a hydrocarbon having a carbon number of 1 to 10 per molecule. The reason why it is preferable to use the straight-chain lower hydrocarbon is that as the carbon number increases, it becomes difficult to supply a hydrocarbon to a film forming apparatus as a vaporized gas and, further, it becomes difficult to achieve decomposition thereof during plasma discharge. Further, as the carbon number increases, high-molecular hydrocarbon components tend to be contained in large quantities as components of a formed protective layer so that the fineness and hardness of the hydrocarbon protective film 22 decrease, which is thus not preferable. Further, in the case of a cyclic hydrocarbon, it is difficult to achieve decomposition thereof during plasma discharge as compared with the straight-chain hydrocarbon, which is thus not preferable. In view of the above, it is particularly preferable to use the straight-chain lower hydrocarbon as a hydrocarbon. Especially, if ethylene is used, it is possible to form a fine hard protective layer, which is thus particularly preferable.

Further, the hydrocarbon protective film forming step S202 preferably forms the hydrocarbon protective film 22 by applying a bias voltage of −50V to −400V to the substrate 12. If less than −50V, the effect of applying the bias voltage is not sufficient. On the other hand, if a bias voltage exceeding −400V is applied, arcing occurs due to the application of excessive energy to the substrate to cause particles or contamination, which is thus not preferable.

The nitrogen-containing film forming step S204 is a step of introducing nitrogen into the surface of the hydrocarbon protective film 22 by a plasma CVD method using a nitrogen gas. By this, the nitrogen-containing film forming step S204 changes the composition of the outermost surface of the hydrocarbon protective film 22, thereby forming the nitrogen-containing film 24 containing nitrogen at the outermost surface of the hydrocarbon protective film 22. By the formation of the nitrogen-containing film 24, the thickness of the hydrocarbon protective film 22 decreases corresponding to the thickness of the outermost surface that has become the nitrogen-containing film 24.

FIG. 3 shows one example of a film forming method in the nitrogen-containing film forming step S204. In this example, the nitrogen-containing film forming step S204 is one example of a thin film forming step that forms a thin film using a plasma-converted substance as a material, wherein the nitrogen-containing film 24 is formed using a material substance concentration means adapted to gather plasma-converted nitrogen around the substrate 12. FIG. 3(a) is a sectional view showing the positional relationship between the substrate 12 formed with up to the hydrocarbon protective film 22 and a material substance concentration means 30. FIG. 3(b) is a top view showing the main surface of the hydrocarbon protective film 22.

The material substance concentration means 30 is a magnet serving to generate a magnetic field (external magnetic field) around the substrate 12 and gathers plasma-converted nitrogen around the substrate 12 by an electromagnetic force. The magnet used as the material substance concentration means 30 is a magnet having a maximum energy product (BH) max of 1.0 to 50 MGOe, preferably 19 to 47 MGOe, and more preferably 37 to 47 MGOe. As such a magnet, use can be made of, for example, a ferrite magnet having a maximum energy product (BH) max of, for example, 1.0 to 4.0 MGOe, an Alnico magnet having a maximum energy product (BH) max of, for example, 4.5 to 5.5 MGOe, a samarium cobalt magnet having a maximum energy product (BH) max of, for example, 19 to 28 MGOe, a neodymium magnet having a maximum energy product (BH) max of, for example, 37 to 47 MGOe, an electromagnet, or the like. In this example, the material substance concentration means 30 is a doughnut-shaped magnet having a circular hole at its central portion. The material substance concentration means 30, being provided at a position where its main surface faces the hydrocarbon protective film 22, generates magnetic lines of force extending in radial directions of the substrate 12 over the hydrocarbon protective film 22. With this configuration, plasma-converted nitrogen being a material of the nitrogen-containing film 24 to be formed on the hydrocarbon protective film 22 (see FIG. 1) can be properly concentrated over the hydrocarbon protective film 22.

Further, in this example, the nitrogen-containing film forming step S204 applies an RF bias to the substrate 12. This makes it possible to generate a high-frequency electric field around the substrate 12 to thereby convert nitrogen into a plasma. Further, the plasma-converted nitrogen can be attracted to the substrate 12. Further, by moving the plasma-converted nitrogen in a fixed direction by a force due to the bias voltage, it is possible to control the direction of the electromagnetic force which the nitrogen receives from the magnetic field generated by the material substance concentration means 30. Thus, with this configuration, the plasma-converted nitrogen can be more properly concentrated around the substrate 12.

The power for the RF bias is preferably set to 400 W or less. If the RF bias is applied with a power exceeding 400 W, there is a possibility of occurrence of damage or the like to the substrate 12.

Herein, if the power is too small, there is also a possibility that the nitrogen-containing film 24 cannot be properly formed. However, according to this example, the power required for the RF bias can be reduced by generating the magnetic field using the material substance concentration means 30. For example, if use is made of the material substance concentration means 30 adapted to generate a magnetic field by a samarium cobalt magnet, the power for the RF bias may be, for example, 300 to 350 W. On the other hand, if use is made of the material substance concentration means 30 adapted to generate a magnetic field by a neodymium magnet, the power for the RF bias may be, for example, 50 to 200 W and preferably 50 to 100 W.

With the above configuration, for example, it is possible to improve the kinetic energy of particles of plasma-converted nitrogen impinging on the surface of the substrate 12 and thus to introduce a sufficient amount of nitrogen into the nitrogen-containing film 24 to be formed at the outermost surface of the hydrocarbon protective film 22. Therefore, according to this example, it is possible to form the nitrogen-containing film 24 that exhibits high adhesion even if the thickness thereof is reduced. This makes it possible to reduce the thickness of the entire protective layer 18. Therefore, according to this example, for example, even if the thickness of the protective layer 18 is set to 5 nm or less, the durability, particularly the reliability characteristics, of the protective layer 18 can be made excellent.

In this example, the film forming method using the material substance concentration means 30 is used only in the nitrogen-containing film forming step S204. However, this film forming method is also applicable to another step as long as it is a step of forming a thin film using a plasma-converted substance as a material.

For example, the hydrocarbon protective film forming step S202 is a step of forming the hydrocarbon protective film 22 by the plasma CVD method using the hydrocarbon gas and thus is considered to be carried out by the film forming method using the material substance concentration means 30. In this case, the material substance concentration means 30, for example, generates a magnetic field around the substrate 12 to gather plasma-converted carbon around the substrate 12 by an electromagnetic force. The other conditions in the hydrocarbon protective film forming step S202 may be, for example, as described with reference to FIG. 2. On the other hand, the bias voltage applied to the substrate 12 may be an RF bias.

With this configuration, the plasma-converted carbon being a material of the hydrocarbon protective film 22 can be concentrated around the substrate 12. Further, by improving the kinetic energy of particles of the plasma-converted carbon impinging on the surface of the substrate 12, the hydrocarbon protective film 22 can be formed as a finer film. This makes it possible to form the hydrocarbon protective film 22 having higher density and higher hardness. Therefore, for example, even if the thickness of the hydrocarbon protective film 22 is reduced, it is possible to ensure the required wear resistance and sliding properties. This makes it possible to properly reduce the thickness of the entire protective layer 18.

Hereinbelow, this invention will be described in further detail with reference to Examples and Comparative Example. In each of the following Examples and Comparative Example, a plurality of magnetic recording media were fabricated while changing the thickness of a protective layer and an RF bias applied to a substrate in a nitrogen-containing film forming step.

EXAMPLE 1

A magnetic recording medium according to Example 1 was fabricated in the following manner. The magnetic recording medium according to Example 1 is a perpendicular magnetic recording medium and comprises a substrate, an adhesive layer, a soft magnetic layer, an underlayer, a magnetic recording layer (magnetic layer), a coupling control layer, an exchange energy control layer, a protective layer, and a lubricating layer.

First, a glass substrate was prepared in a preparation step. In the preparation step, first, an amorphous aluminosilicate glass was molded into a disk shape by direct press, thereby producing a glass disk. This glass disk was ground, polished, and chemically strengthened in sequence, thereby obtaining a smooth nonmagnetic glass substrate in the form of a chemically strengthened glass disk. It was a 2.5-inch magnetic-disk substrate with a substrate diameter of 65 mm, an inner diameter of 20 mm, and a disk thickness of 0.635 mm. The surface roughness of the obtained glass substrate was observed by an AFM (atomic force microscope) and it was confirmed to be a smooth surface with Rmax of 1.2 nm and Ra of 0.16 nm.

Using an evacuated film forming apparatus, the layers from the adhesive layer to the exchange energy control layer were formed in sequence on the obtained substrate in an Ar atmosphere by a known DC magnetron sputtering method and then the protective layer was formed by a CVD method. Thereafter, the lubricating layer was formed by a dip coating method. Hereinbelow, the structures and manufacturing methods of the respective layers will be described.

The adhesive layer was formed using a Ti-alloy target so as to be a Ti-alloy layer of 10 nm. By forming the adhesive layer, the adhesion between the substrate and the soft magnetic layer can be improved and, therefore, it is possible to prevent stripping of the soft magnetic layer. As a material of the adhesive layer, use can be made of, for example, a Ti-containing material. In terms of practical use, the thickness of the adhesive layer is preferably set to 1 to 50 nm.

The soft magnetic layer was formed using a CoTaZr target so as to be an amorphous CoTaZr layer of 50 nm. The underlayer is made of Ru and is formed for improving the crystal orientation of the magnetic recording layer. Using a hard magnetic target made of CoCrPt and $SiO_2$ as an example of a nonmagnetic substance, a layer with an hcp crystal structure of 11 nm was formed as the magnetic recording layer. As the coupling control layer, a Pd (palladium) layer was formed. The coupling control layer can be formed by a Pt layer instead of the Pd layer. The thickness of the coupling control layer is preferably 2 nm or less and more preferably 0.5 to 1.5 nm. The exchange energy control layer was in the form of alternately laminated films of CoB and Pd and was formed in a low Ar gas atmosphere. The thickness of the exchange energy control layer is preferably 1 to 8 nm and more preferably 3 to 6 nm.

Subsequently, in a hydrocarbon protective film forming step in a protective layer forming step, a hydrocarbon protective film was formed by a plasma CVD method while applying a bias of −300V in a mixed gas containing 30% hydrogen in Ar at a pressure where the vacuum was set to 1 Pa. In Example 1, there were formed hydrocarbon protective films whose thicknesses before forming nitrogen-containing films were set to 4.0 nm and 5.0 nm, respectively. Accordingly, in Example 1, the thickness of the protective layer was 4.0 nm or 5.0 nm.

Then, a nitrogen-containing film forming step was carried out using a material substance concentration means adapted to generate a magnetic field by a ferrite magnet. In this step, a nitrogen-containing film was formed by generating a plasma while introducing only a nitrogen gas and adjusting the vacuum to 3 Pa, and at this pressure, exposing the hydrocarbon protective film to a nitrogen atmosphere to perform a surface treatment. The power for RF bias applied to the substrate was set to 300 W or 400 W. By this, there was formed the protective layer having the hydrocarbon protective film and the nitrogen-containing film.

Then, the lubricating layer made of a PFPE (perfluoropolyether) compound was formed by a dipping method on the protective layer having been subjected to ultrapure water and IPA cleaning. In the manner described above, magnetic recording media according to Example 1 were fabricated.

EXAMPLE 2

Magnetic recording media according to Example 2 were fabricated in the same manner as in Example 1 except that a material substance concentration means adapted to generate a magnetic field by an Alnico magnet was used in the nitrogen-containing film forming step.

EXAMPLE 3

Magnetic recording media according to Example 3 were fabricated in the same manner as in Example 1 except that, in the hydrocarbon protective film forming step, there were formed hydrocarbon protective films whose thicknesses before forming nitrogen-containing films were set to 3.0 nm, 3.5 nm, 4.0 nm, and 5.0 nm, respectively, and in the nitrogen-containing film forming step, use was made of a material substance concentration means adapted to generate a magnetic field by a samarium cobalt magnet and the power for RF bias applied to a substrate was set to 200 W, 300 W, or 400 W.

EXAMPLE 4

Magnetic recording media according to Example 5 were fabricated in the same manner as in Example 1 except that, in the hydrocarbon protective film forming step, there were formed hydrocarbon protective films whose thicknesses before forming nitrogen-containing films were set to 2.5 nm, 3.0 nm, 3.5 nm, 4.0 nm, and 5.0 nm, respectively, and in the nitrogen-containing film forming step, use was made of a material substance concentration means adapted to generate a magnetic field by a neodymium magnet and the power for RF bias applied to a substrate was set to 50 W, 100 W, 200 W, 300 W, or 400 W.

COMPARATIVE EXAMPLE 1

Magnetic recording media according to Comparative Example 1 were fabricated in the same manner as in Example 1 except that, in the nitrogen-containing film forming step, no material substance concentration means was used and the power for RF bias applied to a substrate was set to 0 W, 200 W, 300 W, 400 W, or 500 W.

(Evaluation)

Various performances of the magnetic recording media obtained in the Examples and Comparative Example were evaluated and analyzed as follows.

(1) Atomic Ratio (N/C)

During fabrication of the Examples and Comparative Example, the atomic ratio (N/C) of nitrogen/carbon in the nitrogen-containing films was measured by the ESCA after forming the protective layers. The measurement conditions of the ESCA analysis were as follows.

Apparatus: Quantum2000 manufactured by ULVAC-PHI, Incorporated
X-ray Excitation Source: Al—Kα line (1486.6 eV)
X-ray Source: 20 W
Analysis Chamber Vacuum: <2×10$^{-7}$ Pa
Pass Energy: 117.5 eV
Photoelectron Detection Angle: 45°
Measurement Object Peak: CIs, NIs
Analysis Region: 100 μmφ
Number of Times: 10 times (2) LUL Durability Test An LUL durability test was performed using a 2.5-inch HDD adapted to rotate at 5400 rpm and a magnetic head with a flying height of 10 nm. An NPAB (negative pressure type) slider was used as a slider of the magnetic head and a TMR element was used as a reproducing element. The magnetic recording medium was mounted in this HDD and the LUL operations were continuously repeated using the above magnetic head. The LUL durability was evaluated by measuring the number of LUL times endured with no occurrence of failure of the HDD. The test was performed in an environment of 70 C/80% RH. This condition is more severe than a normal HDD operating environment. This is for more accurately judging the durability/reliability of the magnetic recording medium by performing the test in the environment assuming HDDs for use in an application such as car navigation.

Normally, in the LUL durability test, it is required that the number of LUL times exceeds 400,000 times continuously with no failure. It is reported that, in the normal HDD using environment, use for about 10 years is necessary for the number of LUL times to exceed 400,000 times.

Tables 1 to 3 show the results of the above evaluation.

TABLE 1

| | Kind of Magnet (BH)max [MGOe] | Thickness of Protective Layer [nm] | RF Bias [W] | Nitrogen/Carbon Atomic Ratio (N/C) | LUL Endurance Cycles |
|---|---|---|---|---|---|
| Example 1 | ferrite 1.0-4.0 | 5.0 | 300 | 0.035 | 100,000 cycles or less |
| | | 5.0 | 400 | 0.093 | 1,000,000 cycles or more |
| | | 4.0 | 400 | 0.112 | 550,000 cycles or less |

TABLE 1-continued

| | Kind of Magnet (BH)max [MGOe] | Thickness of Protective Layer [nm] | RF Bias [W] | Nitrogen/Carbon Atomic Ratio (N/C) | LUL Endurance Cycles |
|---|---|---|---|---|---|
| Example 2 | alnico 4.5-5.5 | 5.0 | 300 | 0.044 | 400,000 cycles |
| | | 5.0 | 400 | 0.095 | 1,000,000 cycles or more |
| | | 4.0 | 400 | 0.114 | 550,000 cycles or less |
| Example 3 | samarium cobalt 19-28 | 5.0 | 200 | 0.041 | 500,000 cycles |
| | | 5.0 | 300 | 0.095 | 1,000,000 cycles or more |
| | | 5.0 | 400 | 0.113 | 1,000,000 cycles or more |
| | | 4.0 | 400 | 0.130 | 1,000,000 cycles or more |
| | | 3.5 | 400 | 0.150 | 1,000,000 cycles or more |
| | | 3.0 | 400 | 0.181 | 550,000 cycles or less |

TABLE 2

| | Kind of Magnet (BH)max [MGOe] | Thickness of Protective Layer [nm] | RF Bias [W] | Nitrogen/Carbon Atomic Ratio (N/C) | LUL Endurance Cycles |
|---|---|---|---|---|---|
| Example 4 | neodymium 37-47 | 5.0 | 50 | 0.048 | 1,000,000 cycles or more |
| | | 5.0 | 100 | 0.064 | 1,000,000 cycles or more |
| | | 5.0 | 200 | 0.115 | 1,000,000 cycles or more |
| | | 5.0 | 300 | 0.176 | 400,000 cycles |
| | | 5.0 | 400 | 0.206 | 100,000 cycles |
| | | 4.0 | 100 | 0.077 | 1,000,000 cycles or more |
| | | 3.5 | 100 | 0.096 | 1,000,000 cycles or more |
| | | 3.0 | 100 | 0.120 | 1,000,000 cycles or more |
| | | 2.5 | 100 | 0.149 | 1,000,000 cycles or more |
| | | 2.5 | 50 | 0.109 | 1,000,000 cycles or more |

TABLE 3

| | Kind of Magnet (BH)max [MGOe] | Thickness of Protective Layer [nm] | RF Bias [W] | Nitrogen/Carbon Atomic Ratio (N/C) | LUL Endurance Cycles |
|---|---|---|---|---|---|
| Comparative Example 1 | non | 5.0 | 0 | 0.000 | failed immediately after start |
| | | 5.0 | 200 | 0.005 | failed immediately after start |
| | | 5.0 | 300 | 0.033 | 100,000 cycles or less |
| | | 5.0 | 400 | 0.088 | 1,000,000 cycles or more |
| | | 5.0 | 500 -->substrate damaged | — | — |
| | | 4.0 | 400 | 0.106 | 600,000 cycles or less |

With respect to the Examples and Comparative Example, a comparison was made between the atomic ratios (N/C) of nitrogen to carbon for the same thickness of the protective layers and the same RF bias and it is seen that the atomic ratio (N/C) is greater in each of the Examples where the material substance concentration means is used, than in the Comparative Example. Therefore, it is seen that nitrogen was efficiently introduced into the nitrogen-containing film at the outermost surface of the protective layer by the use of the material substance concentration means.

Further, in each of the Examples, 1,000,000 or more LUL times were realized by selecting the thickness of the protective layer and the RF bias condition. Particularly, in Examples 3 and 4, 1,000,000 or more LUL times were realized even when the RF bias was set smaller than that in the Comparative Example. It is considered that when the RF bias is smaller, the thickness of the nitrogen-containing film is reduced. Accordingly, from this, it is seen that the lubricity to the lubricating layer is ensured even when the thickness of the nitrogen-containing film is reduced.

Further, for example, when use is made of a magnet having a maximum energy product (BH) max of 19 to 28 MGOe as in Example 3, it is seen that the RF bias is preferably set to 300 to 400 W. On the other hand, when use is made of a magnet having a maximum energy product (BH) max of 37 to 47 MGOe as in Example 4, it is seen that the RF bias is preferably set to 50 to 200 W.

Further, in Examples 3 and 4, 1,000,000 or more LUL times were realized even when the thickness of the protective layer was reduced as compared with the Comparative Example. Particularly, in Example 4, 1,000,000 or more LUL times were realized even when the thickness of the protective layer was set to 3 nm or less (2.5 to 3 nm).

In the Comparative Example, when the RF bias power was set to 500 W, the substrate was damaged and it was not possible to fabricate a magnetic recording medium. Although not described above, this also applies to each of the Examples when the RF bias power is set to 500 W or more.

Further, in Comparative Example 1, when the RF bias power was set to 0 W or 200 W, the HDD failed immediately after the start of the LUL durability test. This also applies to each of the Examples when the RF bias power is set to 0 W.

EXAMPLE 5

An amorphous aluminosilicate glass is molded into a disk shape by direct press, thereby producing a glass disk. This glass disk is ground, polished, and chemically strengthened in sequence, thereby obtaining a smooth nonmagnetic disk substrate in the form of a chemically strengthened glass disk. It is a 2.5-inch magnetic-disk substrate with a glass substrate diameter of 65 mm, an inner diameter of 20 mm, and a disk thickness of 0.635 mm. The surface roughness of the obtained glass substrate is such that when observed by an AFM (atomic force microscope), it is a smooth surface shape with Rmax of 2.18 nm and Ra of 0.18 nm. Rmax and Ra follow Japanese Industrial Standard (JIS).

Then, an adhesive layer 112, a soft magnetic layer 114, an orientation control layer 116, an underlayer 118, a first onset layer 120, a second onset layer 122, and a main recording layer 124 are formed in sequence on the disk substrate 110 by DC magnetron sputtering (see FIG. 4).

First, the adhesive layer 112 is formed using a CrTi target so as to be a CrTi layer of 10 nm.

Then, soft magnetic layers 114*a* and 114*c* are each formed so as to be an amorphous FeCoTaZr layer of 15 nm. Further, a Ru layer of 2 nm is formed as a first nonmagnetic spacer layer 114*b*.

Then, on the soft magnetic layer 114, there are formed, in sequence, the orientation control layer 116 of 10 nm made of NiW, underlayers 118*a* and 118*b* each having a thickness of 10 nm and made of Ru (film formation is performed so that the film forming gas pressure for the Ru layer as the underlayer 118*a* is set smaller than that for the Ru layer as the underlayer 118*b*), the first onset layer 120 of 1.0 nm made of CoCr—SiO$_2$, the second onset layer 122 of 3 nm made of CoCrPt—Cr$_2$O$_3$, the main recording layer 124 of CoCrPt—TiO$_2$, a continuous layer 126, and a medium protective layer 128.

The onset layers 120 and 122 are nonmagnetic granular layers. By forming the nonmagnetic granular layers on an hcp crystal structure of the underlayer 118 and growing a granular layer as the main recording layer 122 thereon, there is a function of separating the magnetic granular layer from the initial stage (rising).

The main recording layer (granular layer) 124 is formed using a hard magnetic target of 8 nm made of hcp crystal structure CoCrPt—TiO$_2$. Further, the continuous layer 126 is formed using a CoCrPtB target of 7.5 nm (see FIG. 4).

Subsequently to the continuous layer 128, the medium protective layer 128 is formed in the following steps.

First, in a hydrocarbon protective film forming step in a protective layer forming step, a hydrocarbon protective film was formed by a plasma CVD method while applying a bias of −300V in a mixed gas containing 30% hydrogen in Ar at a pressure where the vacuum was set to 1 Pa. In Example 5, there were formed hydrocarbon protective films whose thicknesses before forming nitrogen-containing films were set to 4.0 nm and 5.0 nm, respectively. Accordingly, in Example 5, the thickness of the protective layer was 4.0 nm or 5.0 nm.

Then, a nitrogen-containing film forming step was carried out using a material substance concentration means adapted to generate a magnetic field by a ferrite magnet. In this step, a nitrogen-containing film was formed by generating a plasma while introducing only a nitrogen gas and adjusting the vacuum to 3 Pa, and at this pressure, exposing the hydrocarbon protective film to a nitrogen atmosphere to perform a surface treatment. The power for RF bias applied to the substrate was set to 300 W or 400 W. By this, there was formed the protective layer 128 having the hydrocarbon protective film and the nitrogen-containing film.

Then, a lubricating layer made of a PFPE (perfluoropolyether) compound was formed by a dipping method on the protective layer having been subjected to ultrapure water and IPA cleaning (see FIG. 4). The thickness of the lubricating layer was 1 nm.

In the manner described above, perpendicular magnetic recording media according to Example 5 were fabricated.

Various performances of the magnetic recording media obtained in Example 5 were evaluated and analyzed in the same manner as in Example 1.

As a result, it was confirmed that the same evaluation results as those in Example 1 were obtained. Specifically, with respect to Example 5 and the Comparative Example, a comparison was made between the atomic ratios (N/C) of nitrogen to carbon for the same thickness of the protective layers and the same RF bias and it was confirmed that the atomic ratio (N/C) was greater in Example 5 where the material substance concentration means was used, than in the Comparative Example. From this, it was confirmed that nitrogen was efficiently introduced into the nitrogen-containing film at the outermost surface of the protective layer by the use of the material substance concentration means. Further, in Example 5, 1,000,000 or more LUL times were realized by selecting the thickness of the protective layer and the RF bias condition.

While this invention has been described with reference to the embodiments, the technical scope of the invention is not limited to the scope of the description of the above embodiments. It is obvious to a person skilled in the art that various changes or improvements can be added to the above embodiments. It is clear from the scope of claims that the modes added with such changes or improvements can also be included in the technical scope of this invention.

Industrial Applicability

This invention is suitably applicable to, for example, a magnetic recording medium manufacturing method.

DESCRIPTION OF SYMBOLS

Figure 1:
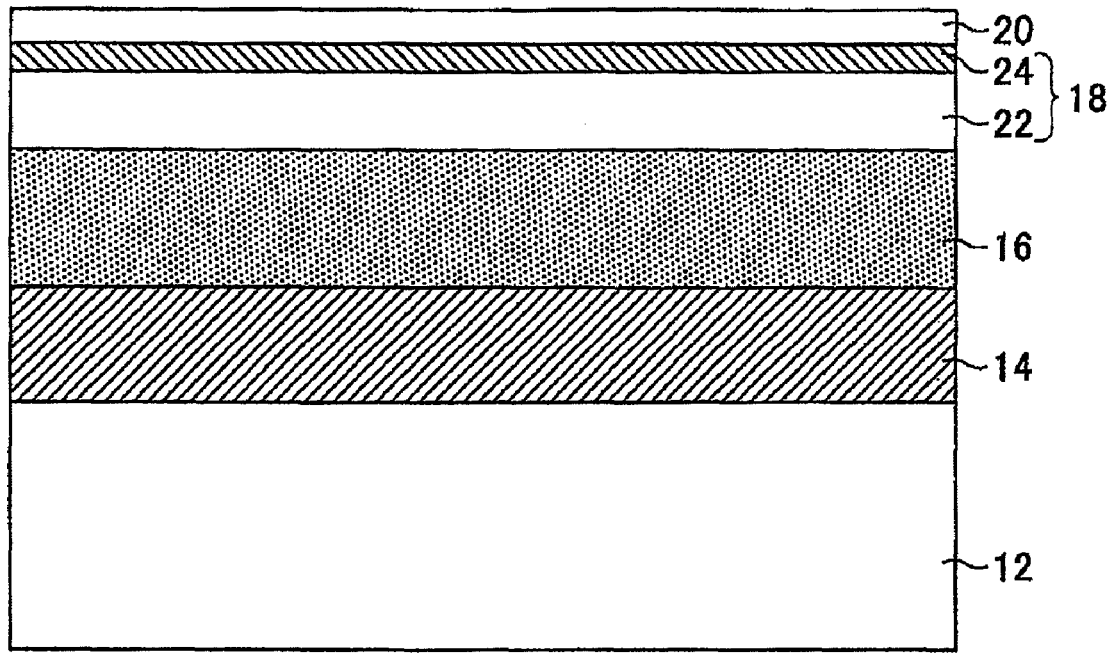
FIG. 1 is a diagram showing one example of the structure of a magnetic recording medium 10 manufactured by a magnetic recording medium manufacturing method according to one embodiment of this invention.
Figure 2:
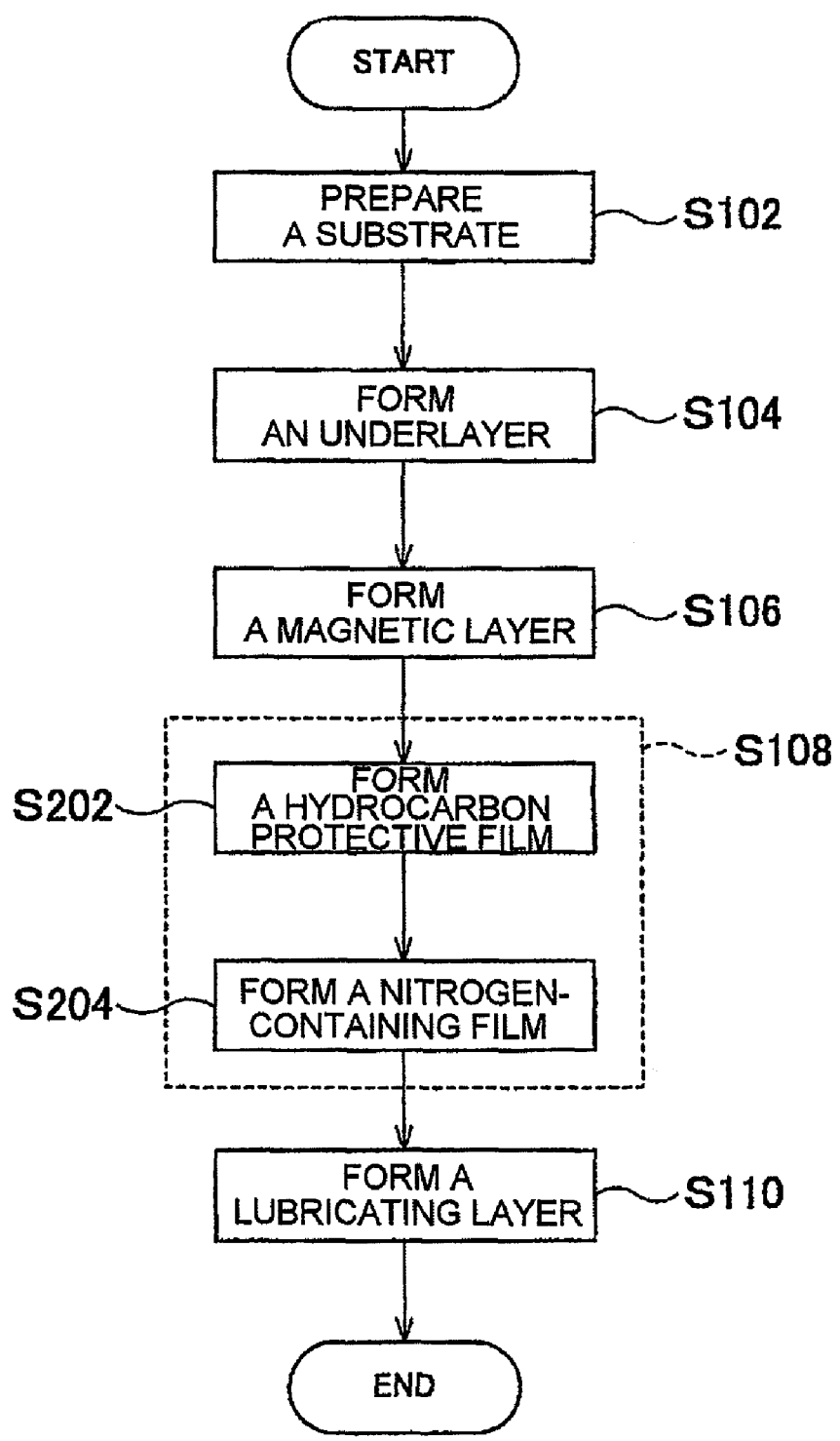
FIG. 2 is a flowchart showing one example of a method of manufacturing the magnetic recording medium 10 of this example.
Figure 3:
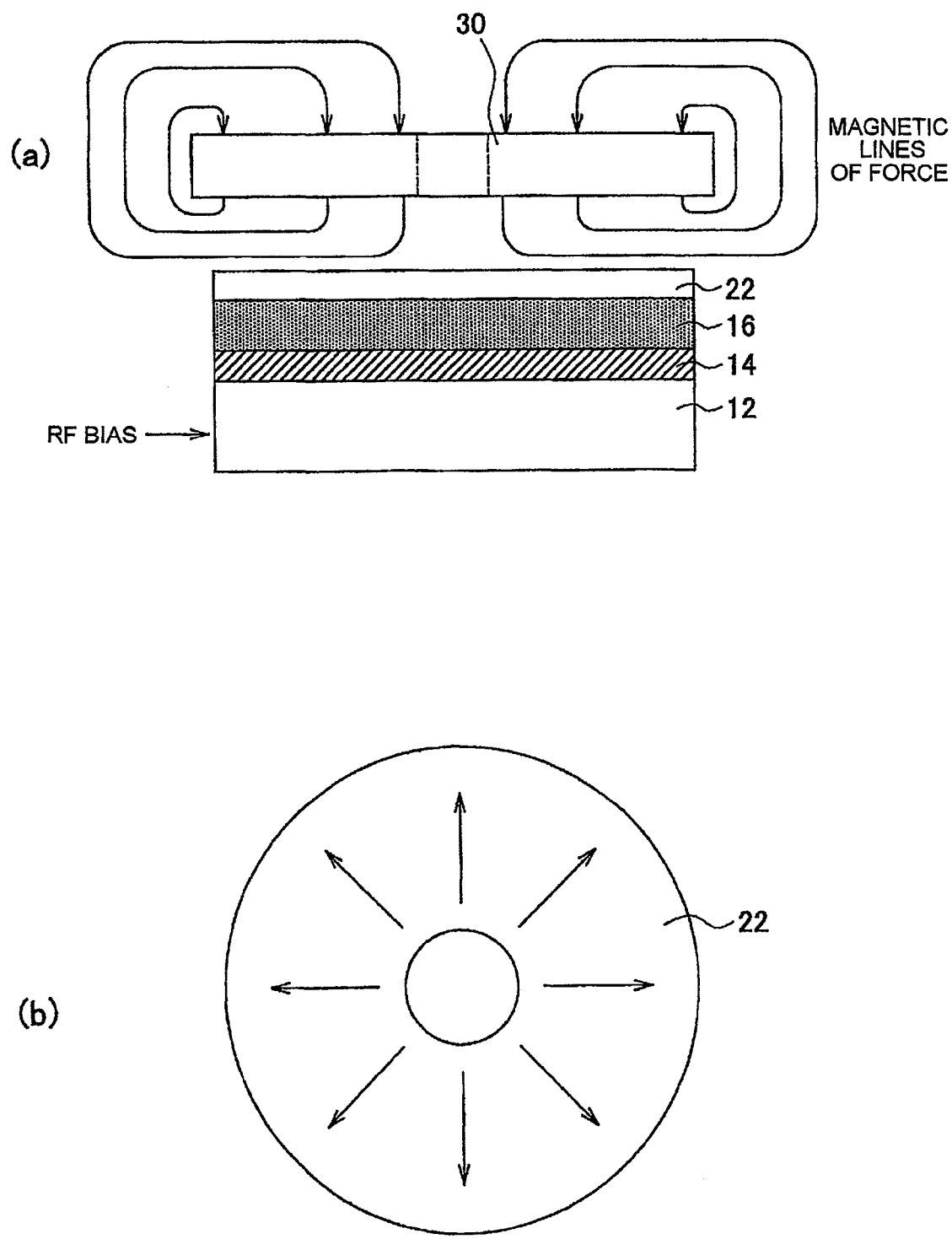
FIG. 3 is a diagram showing one example of a film forming method in a nitrogen-containing film forming step S204, wherein FIG. 3(*a*) is a sectional view showing the positional relationship between a substrate 12 formed with up to a hydrocarbon protective film 22 and a material substance concentration means 30 and FIG. 3(*b*) is a top view showing the main surface of the hydrocarbon protective film 22.
Figure 4:
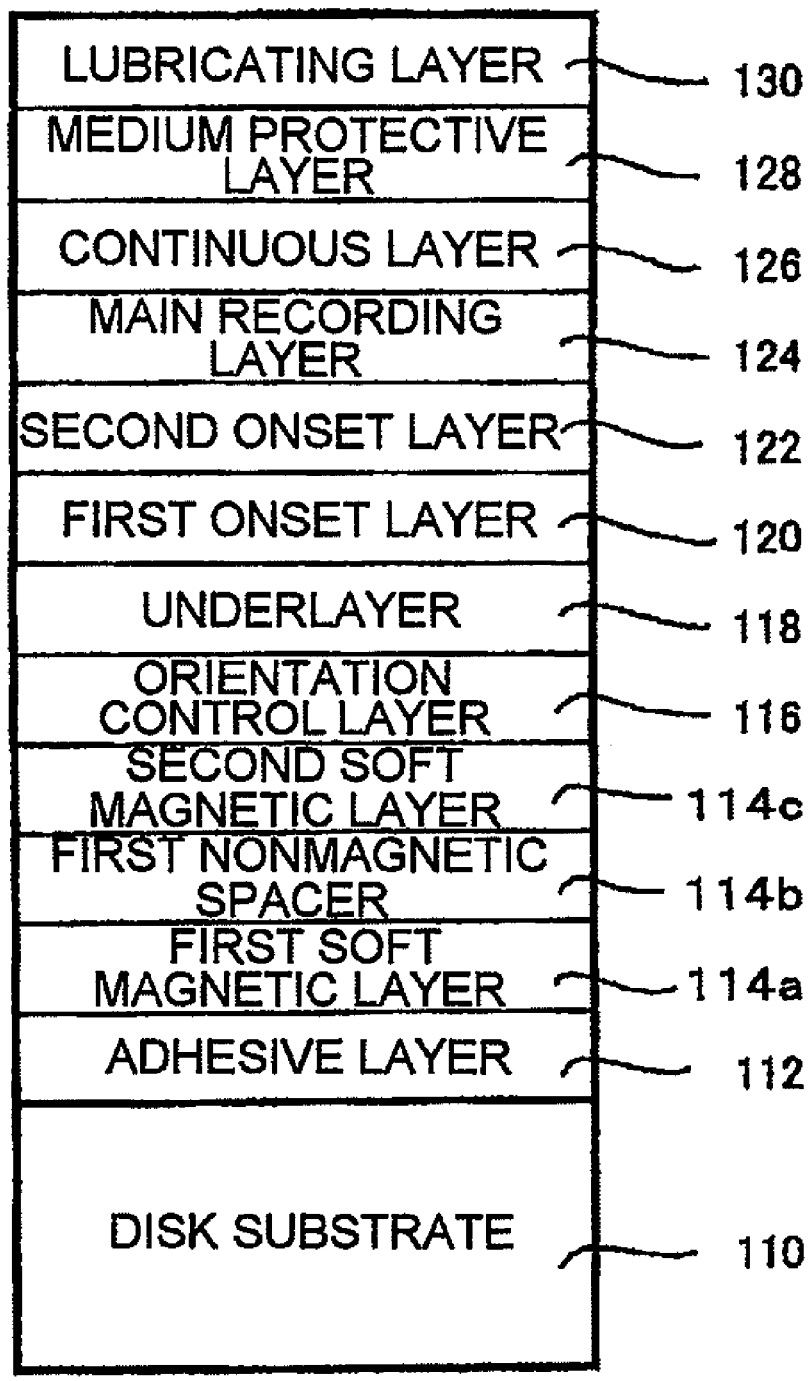
FIG. 4 is a diagram showing one example of the structure of a magnetic recording medium manufactured by a magnetic recording medium manufacturing method according to another embodiment of this invention.

10 . . . magnetic recording medium, 12 . . . substrate, 14 . . . underlayer, 16 . . . magnetic layer, 18 . . . protective layer, 20 . . . lubricating layer, 22 . . . hydrocarbon protective film, 24 . . . nitrogen-containing film, 30 . . . material substance concentration means

The invention claimed is:

1. A magnetic recording medium manufacturing method of forming a thin film over a substrate, said magnetic recording medium manufacturing method characterized by comprising
a magnetic layer forming step of forming a magnetic layer over said substrate;
a protective film forming step of forming a hydrocarbon protective film over said magnetic layer; and a thin film forming step of forming said thin film using a plasma-converted substance as a material, wherein said thin film forming step forms said thin film using material substance concentration means for gathering said plasma-converted substance around said substrate by generating a magnetic field around said substrate using a magnet having a maximum energy product of 1.0 to 50 MGOe, the magnet being provided at a position facing an outermost surface of said hydrocarbon protective film, the outermost surface being opposite of a side of said hydrocarbon protective film that is closer to said magnetic layer;

and said thin film forming step is a step of introducing nitrogen into a surface of said hydrocarbon protective film by a plasma CVD method using a nitrogen gas and by applying a bias voltage to said substrate, thereby forming a film containing the nitrogen at the outermost surface of said hydrocarbon protective film.

2. A magnetic recording medium manufacturing method according to claim 1, characterized in that said thin film forming step applies an RF bias with a power of 400 W or less to said substrate.

3. A magnetic recording medium manufacturing method according to claim 1, characterized in that said protective film forming step forms said hydrocarbon protective film having a thickness of 5 nm or less, and said thin film forming step forms the film containing the nitrogen wherein an atomic ratio (N/C) of nitrogen to carbon at the outermost surface is 0.05 to 0.15.

4. A magnetic recording medium manufacturing method according to claim 1, wherein said protective film forming step forms said hydrocarbon protective film over said magnetic layer by a plasma CVD method using a hydrocarbon gas.

5. A laminate manufacturing method of forming a thin film over a substrate, said laminate manufacturing method characterized by comprising a magnetic layer forming step of forming a magnetic layer over said substrate;

a protective film forming step of forming a hydrocarbon protective film over said magnetic layer; and a thin film forming step of forming said thin film using a plasma-converted substance as a material, wherein said thin film forming step forms said thin film using material substance concentration means for gathering said plasma-converted substance around said substrate by generating a magnetic field around said substrate using a magnet having a maximum energy product of 1.0 to 50 MGOe, the magnet being provided at a position facing an outermost surface of said hydrocarbon protective film, the outermost surface being opposite of a side of said hydrocarbon protective film that is closer to said magnetic layer;

and said thin film forming step is a step of introducing nitrogen into a surface of said hydrocarbon protective film by a plasma CVD method using a nitrogen gas and by applying a bias voltage to said substrate, thereby forming a film containing the nitrogen at the outermost surface of said hydrocarbon protective film.

* * * * *